(12) United States Patent
Yan (10) Patent No.: US 11,114,515 B2
(45) Date of Patent: Sep. 7, 2021

(54) ORGANIC LIGHT-EMITTING DIODE DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Bo Yan, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 82 days.

(21) Appl. No.: 16/621,946

(22) PCT Filed: Nov. 4, 2019

(86) PCT No.: PCT/CN2019/115406
§ 371 (c)(1),
(2) Date: Dec. 12, 2019

(87) PCT Pub. No.: WO2021/012456
PCT Pub. Date: Jan. 28, 2021

(65) Prior Publication Data
US 2021/0028254 A1    Jan. 28, 2021

(30) Foreign Application Priority Data

Jul. 23, 2019  (CN) .......................... 201910668142.8

(51) Int. Cl.
*H01L 27/32*       (2006.01)
*H01L 51/00*       (2006.01)
(Continued)

(52) U.S. Cl.
CPC ...... *H01L 27/3246* (2013.01); *H01L 51/0008* (2013.01); *H01L 51/5253* (2013.01); *H01L 51/56* (2013.01)

(58) Field of Classification Search
CPC ............. H01L 27/3246; H01L 27/3283; H01L 27/3295; H01L 51/5253–5256
See application file for complete search history.

(56) References Cited

U.S. PATENT DOCUMENTS

| 9,716,130 B2 | 7/2017 | Kang |
| 2005/0174045 A1* | 8/2005 | Lee ...................... C08G 61/025 313/504 |

(Continued)

FOREIGN PATENT DOCUMENTS

| CN | 103311269 A | 9/2013 |
| CN | 107895736 A | 4/2018 |

(Continued)

*Primary Examiner* — Shaun M Campbell (57) ABSTRACT

An organic light-emitting diode (OLED) display panel and a manufacturing method thereof are provided. The OLED display panel includes a substrate, a pixel defining layer, an organic light-emitting layer, and an organic encapsulating layer. The pixel defining layer is disposed on the substrate and includes a plurality of recessed regions and a plurality of grooves. The recessed regions communicate with each other through the grooves. The recessed regions and the grooves form a mesh structure. The mesh structure defines a plurality of pixel regions. The organic light-emitting layer is disposed on the pixel defining layer and the organic encapsulating layer is disposed on the organic light-emitting layer.

13 Claims, 7 Drawing Sheets

(51) Int. Cl.
*H01L 51/56* (2006.01)
*H01L 51/52* (2006.01)

(56) References Cited

U.S. PATENT DOCUMENTS

| | | | |
|---|---|---|---|
| 2009/0224664 A1* | 9/2009 | Yoshida | H01L 51/0545 |
| | | | 313/504 |
| 2014/0346468 A1* | 11/2014 | Kim | H01L 27/3246 |
| | | | 257/40 |
| 2016/0043150 A1 | 2/2016 | Wang et al. | |
| 2016/0260928 A1* | 9/2016 | Choi | H01L 51/5253 |
| 2019/0280064 A1* | 9/2019 | Kim | H01L 51/5253 |

FOREIGN PATENT DOCUMENTS

| | | |
|---|---|---|
| CN | 108448002 A | 8/2018 |
| CN | 109166882 A | 1/2019 |

* cited by examiner

ORGANIC LIGHT-EMITTING DIODE DISPLAY PANEL AND MANUFACTURING METHOD THEREOF

FIELD OF INVENTION

The present application relates to a field of display technologies, and more particularly to a flexible organic light-emitting diode display panel and a manufacturing method of thereof.

BACKGROUND OF INVENTION

Organic light-emitting diodes (OLEDs) possess characteristics of flexible display and are considered to be a new generation of display technologies. OLEDs have broad application prospects in mobile devices, especially smart phones. With development of display technologies, static bending and dynamic bending display products have become a battleground for panel manufacturers. In order to reduce bending stress of OLED panels, reductions of a thickness of each film layer have become key factors. Thicknesses of organic encapsulation layers are above 10 μm. Reductions of the thickness of the organic encapsulation layers re particularly important for reducing bending stress of the inorganic encapsulation layers.

Figure 1:
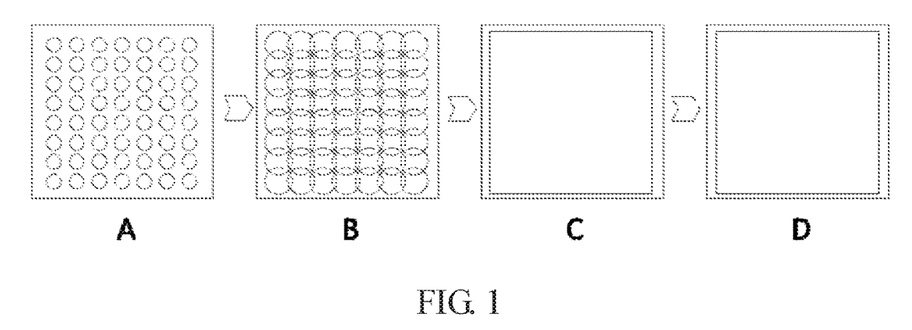
FIG. 1 is a schematic view showing a solution process performed on a film layer of an organic light-emitting diode (OLED) display panel in the prior art.

Film layers of the organic light-emitting diode panels are manufactured by solution processes and specific processes are shown in FIG. 1. Step A shows a state in which a plurality of droplets are just added to a substrate. Step B shows that the droplets spread out and contact with each other. Step C shows that the droplets spread out and become planar. Step D shows ultraviolet curing. Surface flatness after curing is an important indicator to determine qualities of film layers.

Figure 2:
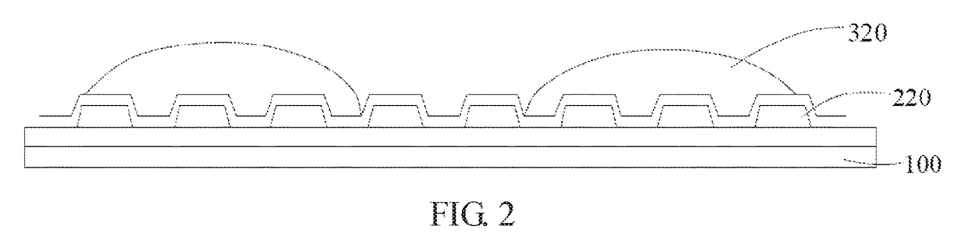
FIG. 2 is a schematic view of a solution process performed on a pixel defining layer of the MED display panel in the prior art.

FIG. 2 is a schematic view of a pixel defining layer 220 of an organic light-emitting diode display panel that is subjected to a solution process in which the droplets 320 are added on the pixel defining layer 220 before curing. Because a surface of the pixel defining layer 220 is not planar, spreading of the droplets is limited by resistance of the pixel defining layer 220. When printing a thin film, there is a risk that the droplets cannot spread flat because of insufficient spreading power.

Therefore, it is necessary to provide an organic light-emitting diode display panel to solve the problems of the prior art.

Technical Problems

In view of the above, the present disclosure provides an organic light-emitting diode display panel to solve a problem that diffusion power of droplets is insufficient and difficult to spread out during solution processes on the pixel defining layer in the prior art.

SUMMARY OF INVENTION

A main object of the present disclosure is to provide an organic light-emitting diode display panel which can facilitate droplets to flow on a pixel defining layer, diffuse onto the entire surface of the pixel defining layer, increase surface flatness, and thin a thickness of the organic encapsulation layer to reduce the bending stress received by the inorganic encapsulation layer.

A secondary object of the present disclosure is to provide a manufacturing method of an organic light-emitting diode display panel suitable for manufacturing an encapsulation layer on a pixel defining layer by various solution processing methods. Also, a minimum of droplets efficiently spread over an entire surface of a pixel defining layer, thereby lowing a limitation of the thickness of the encapsulation layer, which is advantageous for manufacturing a thinner organic light-emitting diode display panel.

To achieve the foregoing objects of the present disclosure, an embodiment of the present disclosure provides an organic light-emitting diode (OLED) display panel, comprising:

a substrate;

a pixel defining layer disposed on the substrate, wherein the pixel defining layer comprises a plurality of recessed regions and a plurality of grooves, wherein the recessed regions communicate with each other through the grooves, the recessed regions and the grooves form a mesh structure, the mesh structure defines a plurality of pixel regions, and widths of the recessed regions is greater than widths of the grooves;

an organic light-emitting layer disposed on the pixel defining layer; and an organic encapsulation layer disposed on the organic light-emitting layer.

In an embodiment of the present disclosure, a height of the grooves from the substrate is lower than a height of the recessed regions from the substrate, such that a height difference between a bottom of the recessed regions and a bottom of the grooves is formed.

In an embodiment of the present disclosure, the widths and the depths of the grooves are configured, such that a plurality of organic encapsulation droplets are spread via capillary force, and the organic encapsulation droplets are used for manufacturing the organic encapsulation layer.

In an embodiment of the present disclosure, the widths of the grooves are greater than 1 μm, and the depths of the grooves range from 0.01 μm to 1.5 μm.

In an embodiment of the present disclosure, a thickness of the organic encapsulation layer ranges 0.01 μm to 10 μm.

In an embodiment of the present disclosure, the OLED display panel further comprises an anode layer disposed at bottoms of the recessed regions.

In an embodiment of the present disclosure, the OLED display panel further comprises an array layer disposed on the substrate, wherein the pixel defining layer is disposed on the array layer, the array layer comprises a drain electrode, and the drain electrode is disposed to correspond to the anode layer and connects the anode layer.

In an embodiment of the present disclosure, the array layer further comprises a first dielectric layer, a second dielectric layer, and a planarization layer, which are disposed on the substrate in sequence, the first dielectric layer comprises a source and a drain, the second dielectric layer comprises a gate, and the drain electrode is disposed between the planarization layer and the second dielectric layer.

Furthermore, an embodiment of the present disclosure provides a manufacturing method of an organic light-emitting diode (OLED) display panel, comprising steps of:

forming a pixel defining layer;

performing a patterning process on the pixel defining layer to form a plurality of recessed regions and a plurality of grooves, wherein the recessed regions communicate with each other through the grooves, the recessed regions and the grooves form a mesh structure, and the mesh structure defines a plurality of the pixel regions;

evaporating an organic light-emitting layer on the pixel defining layer; and adding a plurality of organic encapsulation droplets on the organic light-emitting layer, wherein the organic encapsulation droplets are spread via capillary force to form an organic encapsulation layer.

Furthermore, an embodiment of the present disclosure provides an organic light-emitting diode (OLED) display panel, comprising:

a substrate;

a pixel defining layer disposed on the substrate, wherein the pixel defining layer comprises a plurality of recessed regions and a plurality of grooves, the recessed regions communicate with each other through the grooves, the recessed regions and the grooves form a mesh structure, and the mesh structure defines the pixel regions;

an organic light-emitting layer disposed on the pixel defining layer; and an organic encapsulation layer disposed on the organic light-emitting layer.

In an embodiment of the present disclosure, a height of the grooves from the substrate is lower than a height of the recessed regions from the substrate, such that a height difference between a bottom of the recessed regions and a bottom of the grooves is formed.

In an embodiment of the present disclosure, the widths and the depths of the grooves are configured such that a plurality of organic encapsulation droplets are spread via capillary force, and the organic encapsulation droplets are used for manufacturing the organic encapsulation layer.

In an embodiment of the present disclosure, the widths of the grooves are greater than 1 μm and the depths of the grooves range from 0.01 μm to 1.5 μm.

In an embodiment of the present disclosure, a thickness of the organic encapsulation layer ranges 0.01 μm to 10 μm.

In an embodiment of the present disclosure, the OLED display panel further comprises an anode layer disposed at bottoms of the recessed regions.

In an embodiment of the present disclosure, the OLED display panel further comprises an array layer disposed on the substrate, wherein the pixel defining layer is disposed on the array layer, the array layer comprises a drain electrode, and the drain electrode is disposed to correspond to the anode layer and connects to the anode layer.

In an embodiment of the present disclosure, the array layer further comprises: a first dielectric layer, a second dielectric layer, and a planarization layer which are disposed on the substrate in sequence, the first dielectric layer comprises a source and a drain, the second dielectric layer comprises a gate, and the drain electrode is disposed between the planarization layer and the second dielectric layer.

Beneficial Effects:

Compared with the prior art, the present disclosure provides an organic light-emitting diode display panel and a manufacturing method thereof. A plurality of recessed regions and a plurality of grooves are formed in a same process on the pixel defining layer, which is suitable for manufacturing an encapsulation layer on a pixel defining layer by various solution processes and promotes spreading of the droplets on the pixel defining layer via capillary force. Therefore, the droplets effectively spread over an entire surface of the pixel defining layer, which increases flatness of the surface, lowers a limitation of the thickness the organic encapsulation layer, and reduces bending stresses received by the inorganic encapsulation layer. It is advantageous for manufacturing a thinner organic light-emitting diode display panel and saving costs of multiple processes.

For a better understanding of the aforementioned content of the present invention, preferable embodiments are illustrated in accordance with the attached figures for detailed explanation.

DETAILED DESCRIPTION OF PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", "side", "surrounding", "center", "horizontal", "transverse", "vertical", "longitudinal", "axial", "radial", "uppermost" or "lowermost", etc., is used with reference to the orientation of the figures being described. Therefore, the directional terminology is used for purposes of illustration and is not intended to limit the present invention. In the accompanying figures, units with similar structures are indicated by the same reference numbers.

The terms "comprise", "includes", and their conjugates mean "including but not limited to".

The terms "a", "an" and "at least one of" as used herein include plural references unless the context clearly dictates otherwise. For example, the term "a processing module" or "at least one processing module" may include a plurality of processing modules, including combination thereof.

As used herein with reference to size or value are not intended to be construed as an inflexible limitation to the precise values. On the contrary, unless otherwise indicated, the various sizes are intended to represent the recited numerical values as well as the functionally equivalent ranges thereof. For example, a disclosed size of "10 μm" refers to "about 10 μm".

Figure 3:
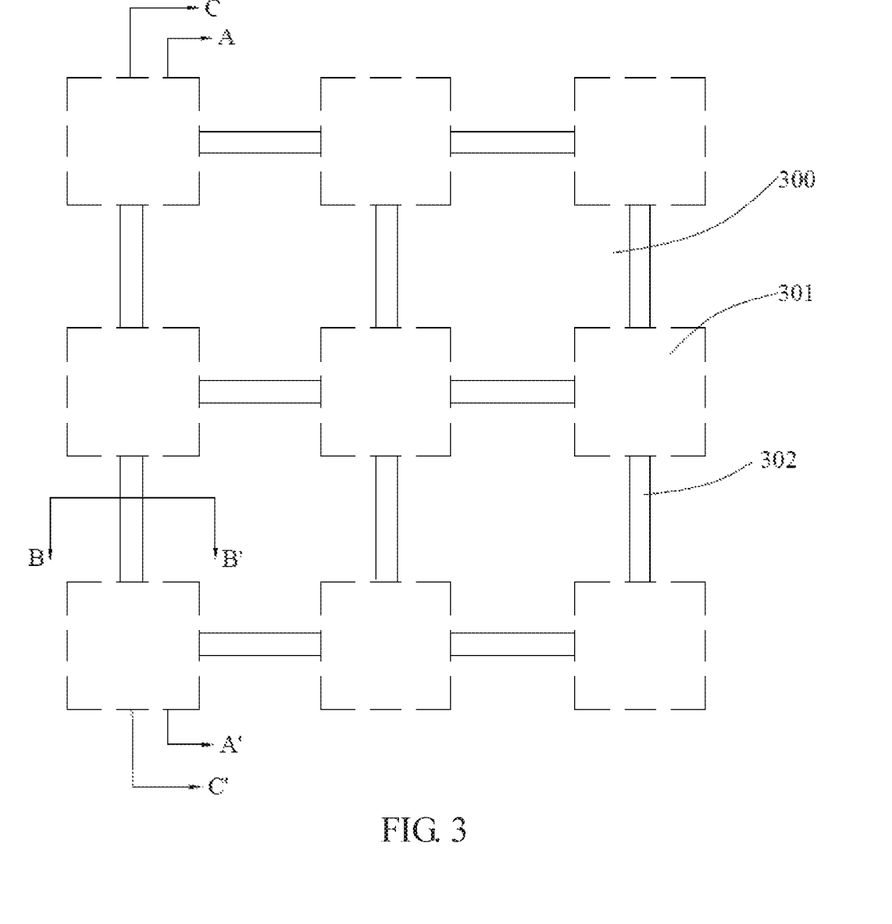
FIG. 3 is a schematic top view of a pixel defining layer of an embodiment of the present disclosure.
Figure 4:
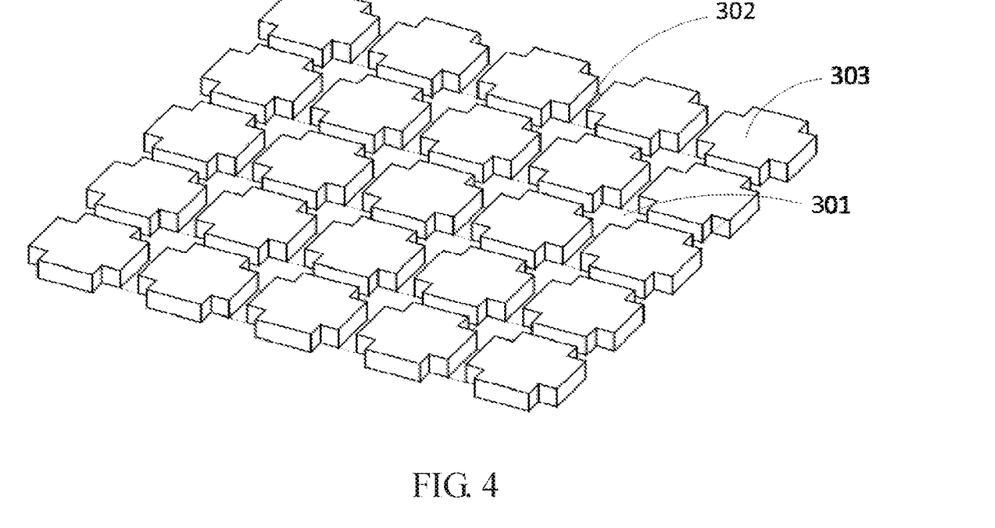
FIG. 4 is a schematic perspective view of the pixel defining layer of FIG. 3.
Figure 5:
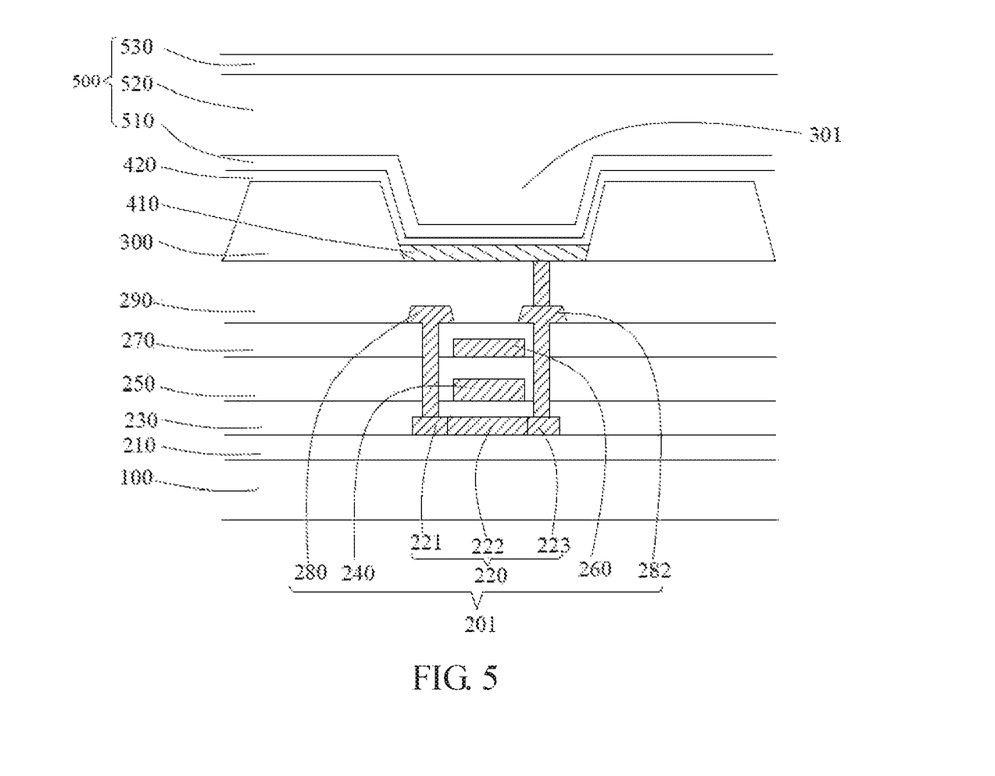
FIG. 5 is a cross-sectional structural view of the pixel defining layer of FIG. 3 taken along line AA'.
Figure 6:
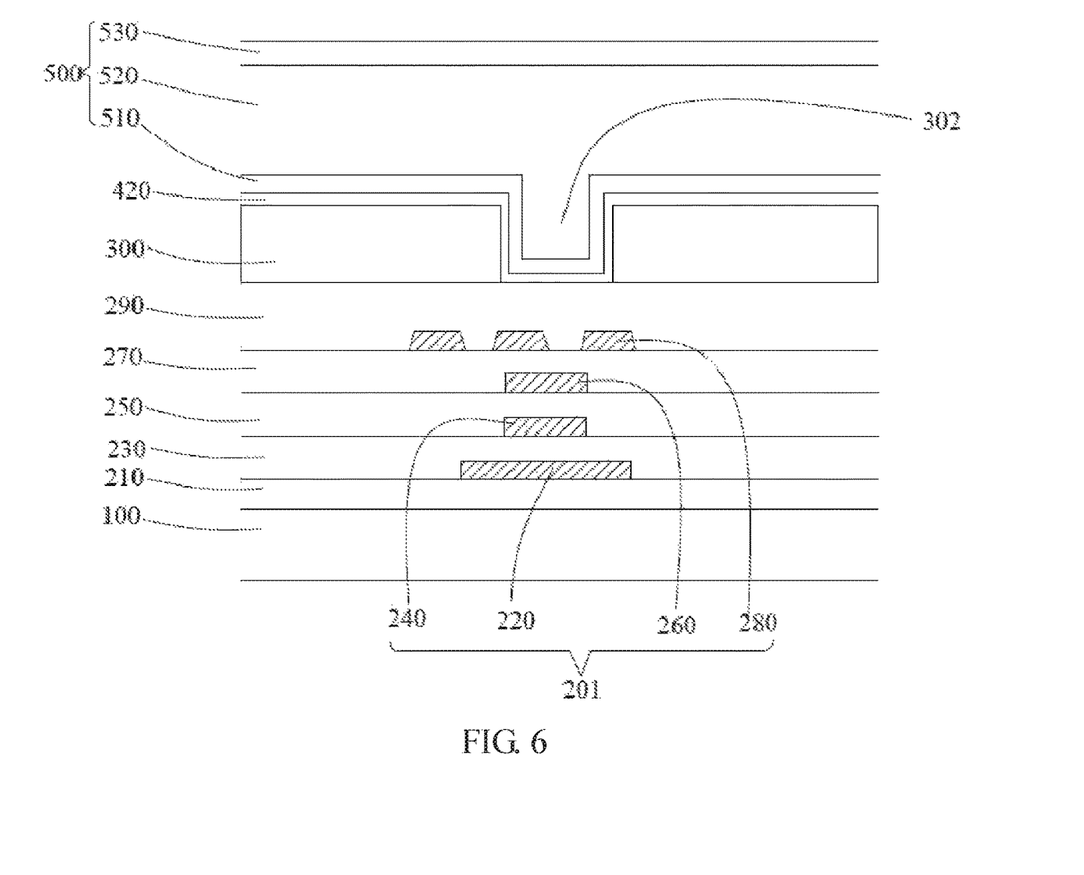
FIG. 6 is a cross-sectional structural view of the pixel defining layer of FIG. 3 taken along line BB'.
Figure 7:
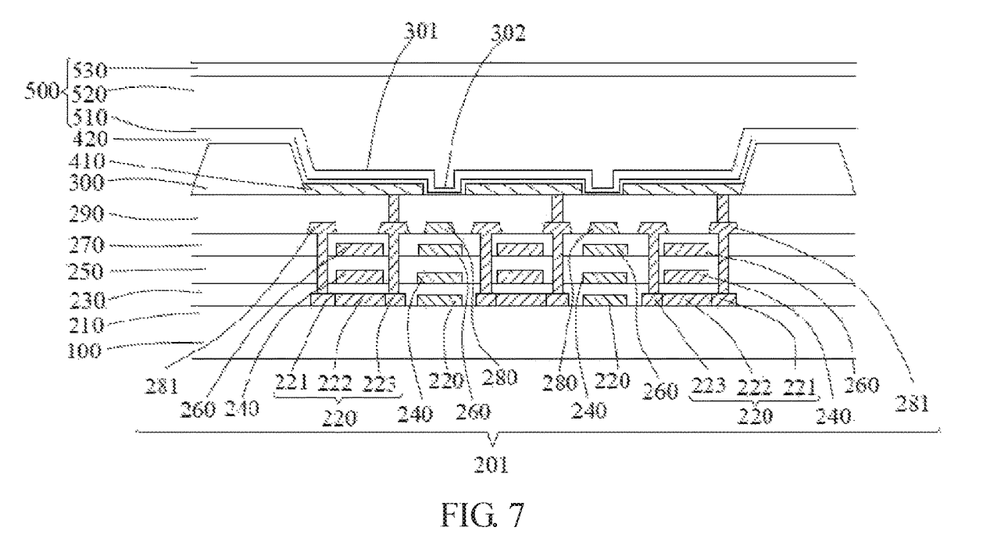
FIG. 7 is a cross-sectional structural view of the pixel defining layer of FIG. 3 taken along line CC'.

Please refer to FIGS. 3-7. FIG. 3 is a schematic top view of a pixel defining layer 300 according to an embodiment of the present disclosure. FIG. 4 is a schematic perspective view of the pixel defining layer 300 of FIG. 3. FIG. 5 is a cross-sectional view of the pixel defining layer 300 of FIG. 3 taken along line AA'. FIG. 6 is a cross-sectional structural view of the pixel defining layer 300 of FIG. 3 taken along line BB'. FIG. 7 is a cross-sectional structural view of the pixel defining layer 300 of FIG. 3 taken along line CC'.

As shown in FIGS. 5-7, an embodiment of the present disclosure provides an organic light-emitting diode (OLED) display panel. The OLED display panel includes a substrate 100, a pixel defining layer 300, an organic light-emitting layer 420, and an encapsulation layer 500. The substrate 100 may be a flexible substrate 100 and a material of the substrate 100 can be polyimide.

As shown in FIGS. 3-4, the pixel defining layer 300 is disposed on the substrate 100. The pixel defining layer 300 includes a plurality of recessed regions 301 and a plurality of grooves 302. The recessed regions 301 communicate with each other through the grooves 302. The recessed regions 301 and the grooves 302 form a mesh structure. The mesh structure defines a plurality of pixel regions. The recessed regions 301 define vapor deposition regions of the organic light-emitting material for forming the organic light-emitting layer 420. In an embodiment of the present disclosure, the pixel defining layer 300 further includes a plurality of cross-shaped spacers 303. The grooves 302 are located between the cross-shaped spacers 303. Every four of the cross-shaped spacers 303 define one of the recessed regions 301.

In an embodiment of the present disclosure, a height of the grooves 302 from the substrate 100 is equal to a height of the recessed regions from the substrate 100. In another embodiment of the present disclosure, as shown in FIG. 6, the height of the groove 302 from the substrate 100 is lower than a height of the recessed regions from the substrate 100, such that a height difference between a bottom of the recessed regions and a bottom of the grooves 302. In an embodiment of the present disclosure, the widths and the depths of the grooves 302 are configured, such that a plurality of organic encapsulation droplets are spread via capillary force 520. The width of the grooves 302 is greater than 1 micrometer (μm) and the depths of the grooves range from 0.01 μm to 1.5 μm.

The organic light-emitting layer 420 is disposed on the pixel defining layer 300. The organic light-emitting layer 420 can include a hole transporting layer, a light-emitting layer, an electron transporting layer, and a cathode layer. The anode layer 410 is disposed at a bottom of the recessed regions 301. A material of the cathode layer and the anode layer 410 can be selected from the group consisting of gold, silver, copper, iron, tin, lead, hafnium, tungsten, molybdenum, neodymium, titanium, tantalum, aluminum, zinc, alloys thereof, and combinations thereof. The light-emitting layer can comprise any known organic electroluminescent material including, but not limited to, polymer-based materials, small molecule-based materials, and dendritic polymer-based materials. The hole transport layer and the electron transport layer may be of any conventional material depending on the type of organic electroluminescent material used.

The encapsulation layer 500 is disposed on the organic light-emitting layer 420. In an embodiment of the present disclosure, the encapsulation layer 500 includes a first inorganic encapsulation layer 510, an organic encapsulation layer 520, and a second inorganic encapsulation layer 530.

In an embodiment of the present disclosure, the OLED display panel further includes: a buffer layer 210, an array layer 201, and a planarization layer. The buffer layer 210 is disposed on the substrate 100. The array layer 201 is disposed on the substrate 100 or the buffer layer 210. The array layer 201 includes a first dielectric layer 230, a second dielectric layer. 250, and a third dielectric layer 270. The first dielectric layer 230 and the second dielectric layer 250 can be gate dielectric layers. The third dielectric layer 270 may be an interlayer dielectric layer. Examples of a material of the dielectric layers include: silicon oxide (SiO and/or $SiO_2$), silicon nitride (SiN), etc.

The array layer 201 further includes a source 221, a drain 223, a channel 222, gates 240, 260, a source electrode 281, and a drain electrode 282. The source 221, the drain 223, and the channel 222 are positioned on the first dielectric layer 230. Materials of the source 221, the drain 223, and the channel 222 can be polysilicon 220. The source 221 and the drain 223 are disposed at two ends of the channel 222. The gate 240 and the gate 260 are respectively disposed on the second dielectric layer 250 and the third dielectric layer 270. The source electrode 281 and the drain electrode 282 are disposed on the planarization layer. The source 221, the drain 223, the channel 222, the gates 240, 260, the source electrode 281, and the drain electrode 282 constitute a driving circuit. In an embodiment of the present disclosure, the source electrode 281 is connected to the source electrode 221 through a first hole 28. The drain electrode 282 is connected to the drain electrode 223 through a second hole 284. The planarization layer 290 is disposed on the third dielectric layer 270 and covers the source electrode 281 and the drain electrode 282.

The pixel definition layer 300 is disposed on the array layer 201. In an embodiment of the present disclosure, the pixel defining layer 300 covers the planarization layer 290. A third hole 291 can be defined on the planarization layer 290. The drain electrode 282 can be disposed corresponding to the anode layer 410 and can be connect to the anode layer 410 via the third hole 291.

Figure 8:
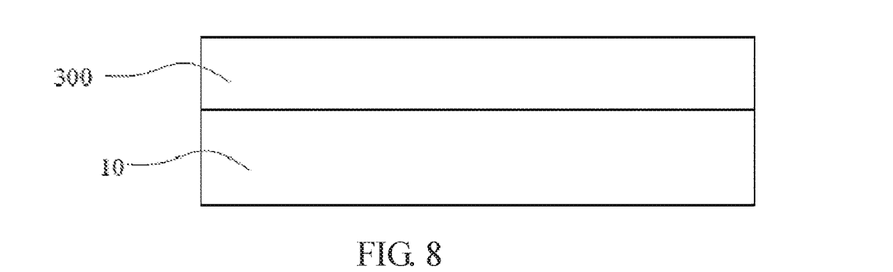
FIG. 8 is a schematic view of manufacturing a pixel defining layer of an embodiment of the present disclosure.
Figure 9:
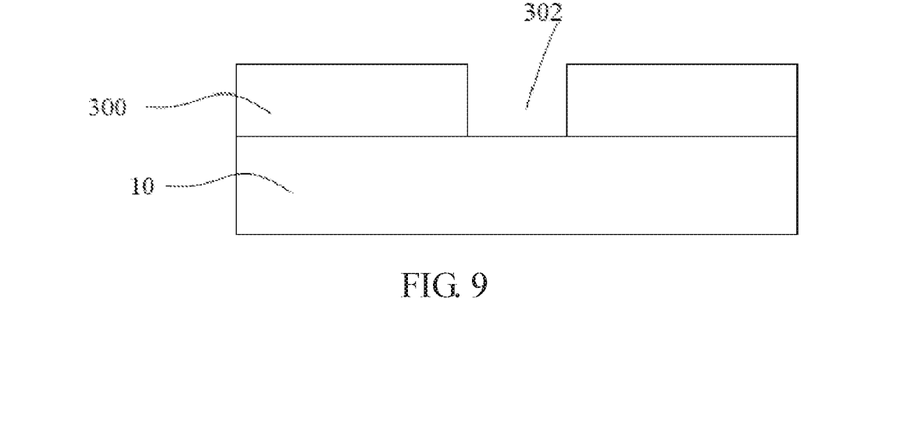
FIG. 9 is a schematic view of the pixel definition layer of FIG. 8 after being subjected to a patterning process.
Figure 10:
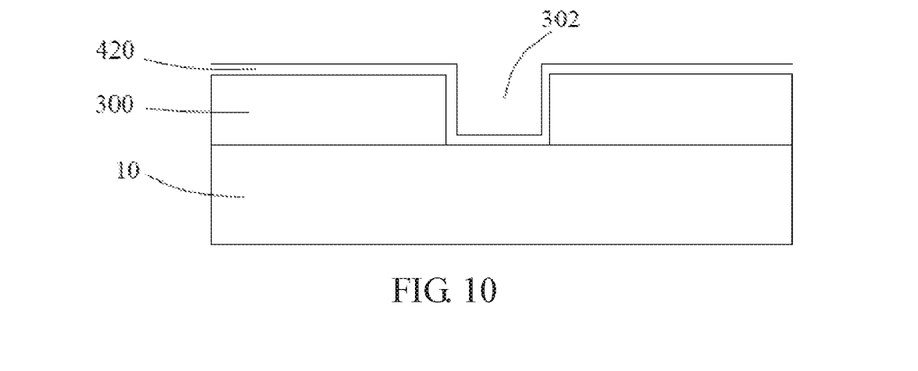
FIG. 10 is a schematic view of vapor-depositing an organic light-emitting layer on the pixel defining layer of FIG. 9.
Figure 11:
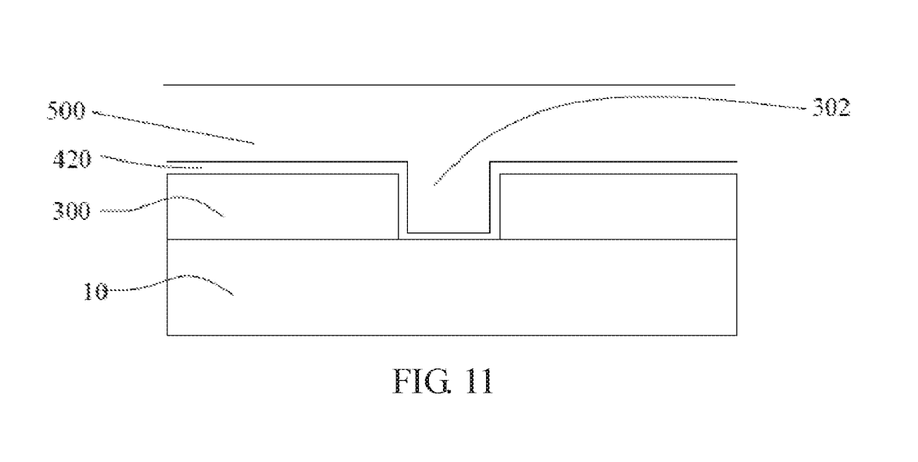
FIG. 11 is a schematic view of forming an organic encapsulation layer on the organic light-emitting layer of FIG. 10.
Figure 12:
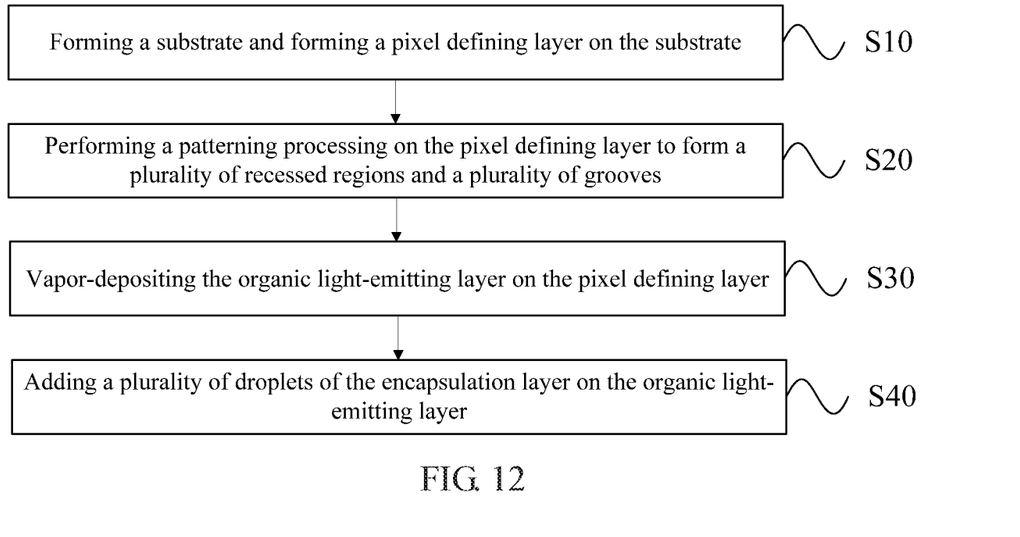
FIG. 12 is a flow chart of a manufacturing method of an OLED display of an embodiment of the present disclosure.

Please refer to FIGS. 8-12. FIG. 8 is a schematic view of manufacturing a pixel defining layer 300 of an embodiment of the present disclosure. FIG. 9 is a schematic view of the pixel definition layer 300 of FIG. 8 after being subjected to a patterning process. FIG. 10 is a schematic view of vapor-depositing an organic light-emitting layer 420 on the pixel defining layer 300 of FIG. 9. FIG. 11 is a schematic view of forming an organic encapsulation layer 420 on the organic light-emitting layer 520 of FIG. 10. FIG. 12 is a flow chart of a manufacturing method of an OLED display of an embodiment of the present disclosure.

According to an embodiment of the present disclosure, a manufacturing method of an OLED display panel, comprising steps of:

As shown in FIG. 8, a step S10 of forming a substrate 100 and forming a pixel defining layer 300 on the substrate. The substrate 100 may be a flexible substrate 100. In an embodiment of the present disclosure, the substrate 100 can be a substrate 100 having an array layer 201 as described above.

As shown in FIG. 9, a step S20 of performing a patterning processing on the pixel defining layer 300 to form a plurality of recessed regions 301 and a plurality of grooves 302. The recessed regions 301 communicate with each other through the grooves 302. The recessed regions 301 and the grooves 302 form a mesh structure. The mesh structure defines a plurality of the pixel regions. In an embodiment of the present disclosure, the recessed regions 301 can define an organic light-emitting material evaporation region for manufacturing the organic light-emitting layer 420. In an embodiment of the present disclosure, the recessed regions 301 and the grooves 302 are formed under a same lithography process, which saves a plurality of processes and costs.

In an embodiment of the present disclosure, the step S20 further includes rinsing a positive photoetching material that is disposed on the recessed regions 301 and the grooves 302 under UV illumination, and etching the recessed regions 301 and the grooves 302. In another embodiment of the present disclosure, the step S20 further includes retaining a negative photo-etching material on portions that is located outside the recessed regions 301 and the grooves 302 of the pixel defining layer 300 under UV illumination, rinsing the negative photoetching material, and etching the recessed regions 301 and the grooves 302.

As shown in FIG. 10, a step S30 of vapor-depositing the organic light-emitting layer 420 on the pixel defining layer 300.

As shown in FIG. 11, a step S40 of adding a plurality of droplets of the encapsulation layer 500 on the organic light-emitting layer 420. The droplets of the organic encapsulation layer spread via capillary force to form an organic encapsulation layer 520 (see FIGS. 5-7).

In an embodiment of the present disclosure, a plurality of droplets of the encapsulation layer 500 can be added to the organic light-emitting layer 420 by a solution process. Examples of the solution process is drop casting, spin coating, spray coating, inkjet printing, and roll-to-roll. In an embodiment of the present disclosure, a plurality of droplets of the encapsulation layer 500 are added on the organic light-emitting layer 420 by inkjet printing to form a thinner organic encapsulation layer 520. During the spreading of the organic encapsulation, due to capillary force, the droplets can spread along the grooves 302 on the pixel defining layer 300 to the adjacent recessed regions 301, which can increase spreading efficiency of the organic layer and is advantageous for enhancing spreading ability of the organic encapsulation layer 520.

It should be noted that the photolithography process used in the present disclosure is one kind of patterning processes, for example can comprise: preprocessing, base film forming, photoresist coating, baking, exposing, developing, etching and other steps. For example, the preprocessing commonly includes: wet cleaning, deionized water cleaning, dewatering baking and other steps; for example, the base film forming can be achieved by using vapor deposition, magnetron sputtering and other methods; for example, the photoresist coating can be achieved through static adhesive coating or dynamic adhesive coating; the baking can be used for removing a solvent in photoresist or a solvent after the developing. Besides, the photolithography process can also comprise: hardening baking, developing inspection and other steps. Steps in the photolithography process which are used when a white photoresist layer and a black photoresist layer are formed and the number of times of using the steps are not limited in the description, as long as the white photoresist layer and the black photoresist layer can be formed. For example, the photolithography process can also comprise several of the above steps, for example the photolithography process comprises photoresist coating, the exposing, developing and other steps.

Compared with the prior art, the present disclosure provides an organic light-emitting diode display panel and a manufacturing method thereof. A plurality of recessed regions and a plurality of grooves are formed in a same process on the pixel defining layer, which is suitable for manufacturing an encapsulation layer on a pixel defining layer by various solution processes and promotes spreading of the droplets on the pixel defining layer via capillary force. Therefore, the droplets effectively spread over an entire surface of the pixel defining layer, which increases flatness of the surface, lowers a limitation of the thickness the organic encapsulation layer, and reduces bending stresses received by the inorganic encapsulation layer. It is advantageous for manufacturing a thinner organic light-emitting diode display panel and saving costs of multiple processes.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. An organic light-emitting diode (OLED) display panel, comprising:
   a substrate;
   a pixel defining layer disposed on the substrate, wherein the pixel defining layer comprises a plurality of recessed regions and a plurality of grooves, wherein the recessed regions communicate with each other through the grooves, the recessed regions and the grooves form a mesh structure, the mesh structure defines a plurality of pixel regions, and widths of the recessed regions is greater than widths of the grooves, a depth of the grooves from the substrate is lower than a depth of the recessed regions from the substrate, such that a height difference between a bottom of the recessed regions and a bottom of the grooves is formed;
   an organic light-emitting layer disposed on the pixel defining layer, wherein the organic light-emitting layer defines the grooves; and
   an organic encapsulation layer disposed on the organic light-emitting layer;
   wherein the widths and the depths of the grooves are configured, such that a plurality of organic encapsulation droplets are spread via capillary force, and the organic encapsulation droplets are used for manufacturing the organic encapsulation layer.

2. The OLED display panel of claim 1, wherein the widths of the grooves are greater than 1 μm, and the depths of the grooves range from 0.01 μm to 1.5 μm.

3. The OLED display panel of claim 1, wherein a thickness of the organic encapsulation layer ranges 0.01 μm to 10 μm.

4. The OLED display panel of claim 1, wherein the OLED display panel further comprises an anode layer disposed at bottoms of the recessed regions.

5. The OLED display panel of claim 4, wherein the OLED display panel further comprises an array layer disposed on the substrate, wherein the pixel defining layer is disposed on the array layer, the array layer comprises a drain electrode, and the drain electrode is disposed to correspond to the anode layer and connects the anode layer.

6. The OLED display panel of claim 5, wherein the array layer further comprises a first dielectric layer, a second dielectric layer, and a planarization layer, which are disposed on the substrate in sequence, the first dielectric layer comprises a source and a drain, the second dielectric layer comprises a gate, and the drain electrode is disposed between the planarization layer and the second dielectric layer.

7. A manufacturing method of an organic light-emitting diode (OLED) display panel, comprising steps of:
   forming a pixel defining layer;
   performing a patterning process on the pixel defining layer to form a plurality of recessed regions and a plurality of grooves, wherein the recessed regions communicate with each other through the grooves, the recessed regions and the grooves form a mesh structure, and the mesh structure defines a plurality of the pixel regions, a depth of the grooves from the substrate is lower than a depth of the recessed regions from the substrate, such that a height difference between a bottom of the recessed regions and a bottom of the grooves is formed;
   evaporating an organic light-emitting layer on the pixel defining layer, wherein the organic light-emitting layer defines the grooves; and
   adding a plurality of organic encapsulation droplets on the organic light-emitting layer, wherein the organic encapsulation droplets are spread via capillary force to form an organic encapsulation layer.

8. An organic light-emitting diode (OLED) display panel, comprising:
   a substrate;
   a pixel defining layer disposed on the substrate, wherein the pixel defining layer comprises a plurality of recessed regions and a plurality of grooves, the recessed regions communicate with each other through the grooves, the recessed regions and the grooves form a mesh structure, and the mesh structure defines the pixel regions, a depth of the grooves from the substrate is lower than a depth of the recessed regions from the substrate, such that a height difference between a bottom of the recessed regions and a bottom of the grooves is formed;
   an organic light-emitting layer disposed on the pixel defining layer an organic light-emitting layer disposed on the pixel defining layer, wherein the organic light-emitting layer defines the grooves; and
   an organic encapsulation layer disposed on the organic light-emitting layer.

9. The OLED display panel of claim 8, wherein the widths of the grooves are greater than 1 μm and the depths of the grooves range from 0.01 μm to 1.5 μm.

10. The OLED display panel of claim 8, wherein a thickness of the organic encapsulation layer ranges 0.01 μm to 10 μm.

11. The OLED display panel of claim 8, wherein the OLED display panel further comprises an anode layer disposed at bottoms of the recessed regions.

12. The OLED display panel of claim 11, wherein the OLED display panel further comprises an array layer disposed on the substrate, wherein the pixel defining layer is disposed on the array layer, the array layer comprises a drain electrode, and the drain electrode is disposed to correspond to the anode layer and connects to the anode layer.

13. The OLED display panel of claim 12, wherein the array layer further comprises: a first dielectric layer, a second dielectric layer, and a planarization layer which are disposed on the substrate in sequence, the first dielectric layer comprises a source and a drain, the second dielectric layer comprises a gate, and the drain electrode is disposed between the planarization layer and the second dielectric layer.

* * * * *